Dec. 22, 1964 H. C. GROSSENHEIDER ETAL 3,162,054

TUNER MECHANISM

Filed May 9, 1962 2 Sheets-Sheet 1

INVENTORS
Howard C. Grossenheider
Richard R. Kolkau
By Cornelius J. O'Connor
Atty.

Dec. 22, 1964 H. C. GROSSENHEIDER ETAL 3,162,054

TUNER MECHANISM

Filed May 9, 1962 2 Sheets-Sheet 2

INVENTORS
Howard C. Grossenheider
Richard R. Kolkau
By Cornelius J. O'Connor
Atty.

United States Patent Office 3,162,054

Patented Dec. 22, 1964

3,162,054
TUNER MECHANISM

Howard C. Grossenheider, Deerfield, and Richard R. Kolkau, Bensenville, Ill., assignors to Zenith Radio Corporation, Chicago, Ill., a corporation of Delaware Filed May 9, 1962, Ser. No. 193,404
5 Claims. (Cl. 74—10.6)

This invention relates in general to tuning mechanisms for wave signal receivers and, in particular, to a fine tuning control for a television receiver.

In television tuners employing switchable channel or frequency selectors, e.g., a turret or a band switch tuner, a pair of viewer-operated tuning controls are provided; a coarse or channel selector and a vernier or fine tuning control. In the turret tuner, a version of which is specifically considered herein, the frequency selectors take the form of demountable tuning strips, each having an adjustable tuning element. The strips are mounted for sequential presentation to a bank of stationary contacts, conventionally designated a stator, which serves to couple the strip instantaneously in registration therewith to the input, amplifying and heterodyning circuits of the tuner. The receiver is conditioned for operation by rotating the channel selector control, either manually or by a remotely controlled motor, until the tuning strip for the desired channel is brought into registration with the stator. If necessary, the fine tuning control is then adjusted to provide optimum picture clarity consonant with good sound quality.

One form of fine tuning control used heretofore comprises a shaft mounted coaxially with the channel selector and a driving element, such as a socket wrench or a gear, for engaging an adjustable tuning element usually arranged for controlling the frequency of the heterodyning oscillator. While such arrangements have been generally satisfactory, it is highly desirable that they permit a particular tuner to be employed in a series of substantially different television models, that is, differing as to cabinet and escutcheon design. Manifestly, a coaxial arrangement of selector and fine-tuning controls severely limits design opportunities not only for the engineer in respect to mechanical aspects but also from the standpoint of aesthetic considerations.

Another feature of current television receivers which is intimately associated with the tuner mechanism and thus must be considered in the design of such mechanisms is the illuminated channel indicator. In general, such indictors include an indicia-bearing disc which is cooperatively associated with the channel selector to the end that a visual identification of the selected channel is projected upon a display screen. The screen may form the front closure of an adjustment knob as, for example, the fine tuning control in the manner of Patent 2,907,298—Steinke, assigned to the same assignee as the present invention, or, as will be shown, the display screen may be integrated into a panel of the cabinet or escutcheon. In either case, and in the interest of insuring proper indexing and simplifying mechanical considerations, the indicia-bearing disc is desirably mounted directly upon the selector shaft. Accordingly, because of the added complexity contributed by the channel indicator, a new approach to the design of the fine tuning control is desired.

While the circumstances suggest a non-concentric fine tuning control approach, in order to divorce the fine tuning control from the channel selector shaft, the art is notably devoid of a mechanically feasible arrangement which is readily and economically adaptable to a variety of cabinet and escutcheon designs. Indeed, offset fine tuning controls of the push-to-actuate variety are known. In one form, a nylon control shaft which terminates in a driver gear is supported by means of a spring loaded plate adjacent to but out of engagement with the adjustable tuning element of the frequency selector instantaneously in the index or operating position of the tuner. To achieve a driving engagement between the driving gear and the tuning element, the plate is shifted or released to enable the bias of a spring to shift the gear into mesh with the tuning element. The ability of this arrangement to accommodate different tuner, cabinet or escutcheon structures is, for all practical purposes, severely limited and, moreover, there is the distinct disadvantage that the driving gear is not positively moved into engagement with the tuning element when fine tuning is to be accomplished.

It is therefore a principal object of the invention to provide an improved non-concentric fine tuning control mechanism which readily adapts itself to a variety of tuner constructions.

It is another object of the invention to provide a fine tuning control which avoids one or more of the shortcomings of prior art arrangements.

It is a more specific object of the invention to provide a fine tuning mechanism which permits a tuner of given construction to be employed with a variety of cabinet and escutcheon designs.

It is a further object of the invention to provide an improved non-concentric fine tuning mechanism which insures positive engagement between an adjusting member and the adjustable element of a frequency selector.

A fine tuning mechanism in accordance with the invention is particularly suited for use in a wave signal receiver having a tuner in which a plurality of adjustable frequency selectors are disposed in a circular array about a reference axis. The fine tuning mechanism comprises a fine tuning control shaft disposed eccentrically of the reference axis at a distance exceeding the radius of the circular array of frequency selectors and supported for both axial and rotational displacement. A driving member, disposed eccentrically of this control shaft, is normally retained in a rest position but is movable to an actuated position. In the latter position, the driving member engages the adjustable portion of the frequency selector instantaneously in the operative position to effect a driving engagement as required for tuning. A coupling link supporting the driving member is disposed transversely of but mechanically engageable with the control shaft. In response to axial displacement of the control shaft, the coupling link is positively displaced and moves the driving member to its actuated position. Finally, means are provided for extending a driving connection from the control shaft to the driving member in order to effect rotation of the driving member in response to rotation of the control shaft.

The features of this invention which are believed to be novel are set forth with particularity in the appended claims. The invention, together with further objects and advantages thereof, may best be understood, however, by reference to the following description taken in conjunction with the accompanying drawings, in the several figures of which like reference numerals identify like elements, and in which:

It will be appreciated, of course, that the tuner to be described constitutes what is conventionally referred to as the front end of a television receiver and includes an input circuit connected to an antenna, a radio-frequency amplifier, a local oscillator, and a first detector or heterodyne stage in which the amplifier radio-frequency signal is converted to a predetermined intermediate frequency for translation to the video and audio circuits of the receiver. The function of the frequency selector portion of the tuner, be it of the turret or bandswitch type, is to modify the circuitry of the front end so that the tuner is highly selective to a desired station frequency. To this end the frequency selector, which instantaneously is determinative of the operation of the tuner, serves to introduce a radio-frequency selector to the antenna input, a radio-frequency tuning impedance to the output of the radio-frequency amplifier, a tunable frequency determining reactance to the local oscillator and a tuning input reactance to the first detector. These impedances are so related to one another that they provide optimum selection of a desired television channel. Since the circuitry of such a tuner as well as its principles of operation are well known to those skilled in the art, for example, see the tuner described in Patent 2,596,117 which issued on December 14, 1954 to John F. Bell et al., further elaboration is deemed unnecessary and attention will be confined to so much of the tuner as required for an understanding of the subject invention.

Figures 1, 2:
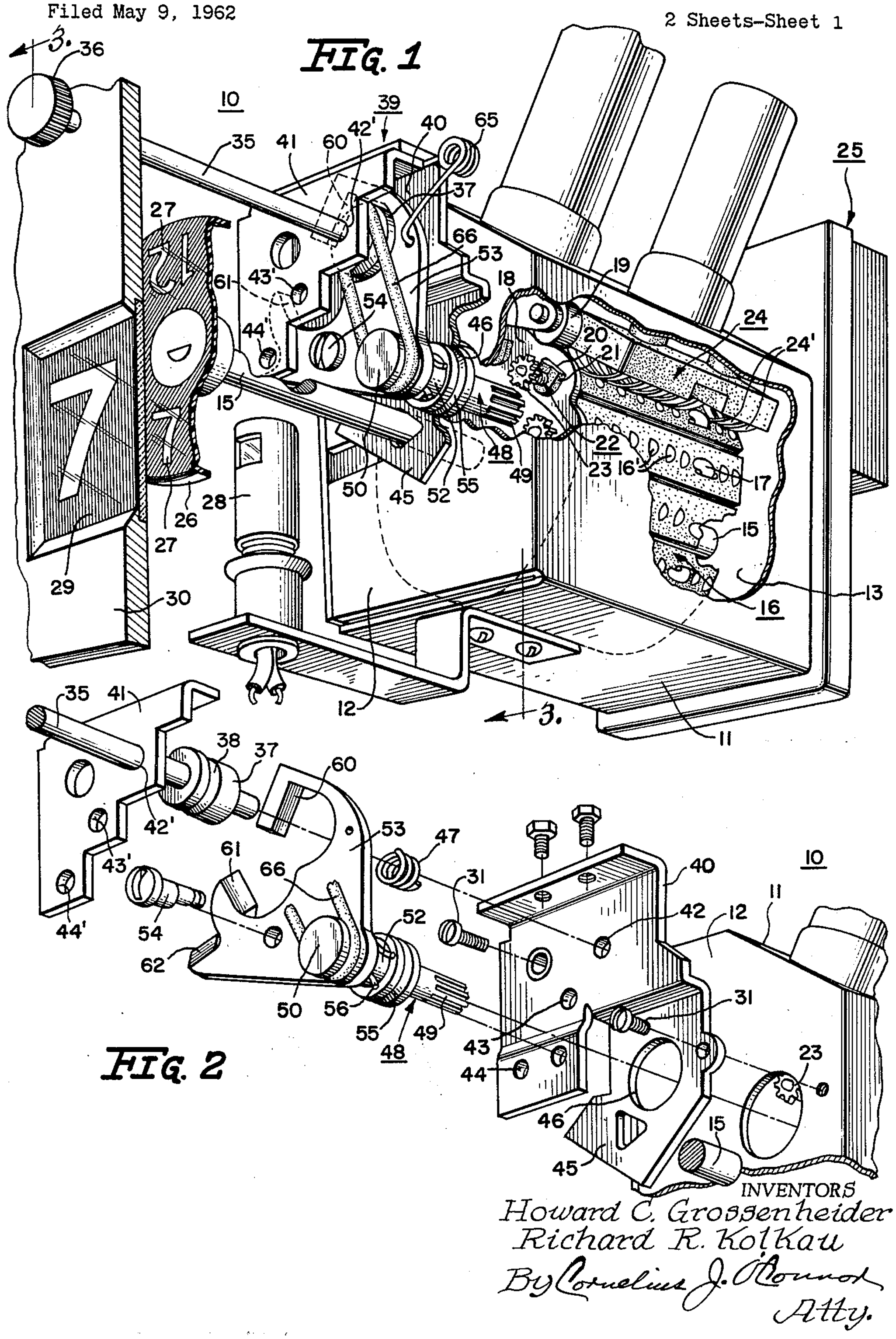
FIGURE 1 is a perspective view, partly in section, of a turret type tuner embodying the subject invention.
FIGURE 2 is an exploded perspective view of a portion of the fine tuning control mechanism.

Referring now in particular to FIGURE 1, the structure there represented is a turret type tuner 10 employed to selectively establish those operating conditions for tuning a television receiver to a desired signal channel. Since the circuitry of the television receiver proper forms no part of the invention, it has been omitted for purposes of simplicity. The tuner includes a housing 11 having end walls 12 and 13 for rotatably supporting a selector shaft 15 which constitutes a reference axis for the tuner. A turret is defined by a plurality of adjustable frequency selectors, or tuning strips 16, which are supported in a circular array about the axis of shaft 15 by a pair of axially aligned panels 17, 18 fixed to and rotatable with turret shaft 15.

Support panel 17 may conveniently take the form of a spider constructed of a number of resilient radially extending arms with one such arm captivating and supporting one end of an assigned tuning strip. End panel 18, on the other hand, is provided with a series of apertures 20, corresponding in number to the maximum number of tuning strips to be accommodated by the turret. Each of strips 16 includes a shoulder 21 at one end having a configuration complementary to and insertable within aperture 20 of panel 18 to provide support for that end of the strip. In a fashion conventional in turret tuner construction, the peripheral edge of panel 18 is scalloped to have a series of indentations which cooperate with a detent roller 19 to afford positive indexing of the turret assembly.

Each of tuning strips 16 carries a series of circuit components, usually inductance coils, for tuning the receiver to a selected channel. The circuit components, in turn, are provided with terminal pairs which are fixed to the body of the strip and have contact surfaces 16′ presentable to a bank of ribbon contacts 24′ supported by a stator assembly 24. The engagement of strip contacts 16′ with stator contacts 24′ completes the circuit connections necessary to place the strip in operative relation with the receiver front end.

It is the adjustment of one or more of the inductance coils on the tuning strip that is involved in vernier or fine tuning of the receiver. Experience has shown that the inductance elements employed to tune the antenna, the radio-frequency amplifier, and the detector can be factory-set to require no subsequent readjustment in the field. On the other hand, the inductance coil which determines the operating frequency of the local or heterodyning oscillator occasionally requires adjustment. This coil is visible in FIGURE 3 and is identified by reference number 32. To this end, each of strips 16 is provided with a displaceable tuning element 22 for modifying the effective inductance of coil 32 depending upon the extent to which element 22 extends within the coil turns. Tuning element 22 is rotatably mounted in shoulder 21 and has a drive portion in the form of a gear 23.

In the disclosed embodiment of the invention, the turret is adjustable to a plurality of operating positions by virtue of a remotely controlled drive mechanism 25 which is coupled to the aft end of shaft 15. This drive may comprise an electric motor and drive arrangement of the type shown and described in the previously mentioned Steinke patent. On the other hand, since the invention contemplates a fine tuning mechanism readily adaptable for use with any turret control, a manual control arrangement for the turret may be employed.

A visual indication of the selected channel is afforded by an indicator arrangement associated with the fore end of selector shaft 15. More particularly, this arrangement includes an opaque disc 26 keyed upon shaft 15 and provided with translucent indicia portions 27 individually identifying one of television channels 2–13. A beamed light source 28 is positioned adjacent mask 26 so that only the channel number identifying the tuning strip in registration with stator 24 is projected upon the rear surface of an indicator window 29. As shown, window 29 is formed as part of the front panel of the receiver cabinet or as a section of an escutcheon member 30.

The fine tuning control of the turret tuner comprises a control shaft 35 disposed eccentrically of the axis of selector shaft 15 and at a distance therefrom which exceeds the radius of the circular array of tuning strips 16. Shaft 35 terminates at one end in a control knob 36 and carries a cam actuator 37 having a sheave portion 38 near the opposite end, see FIGURE 2. Shaft 35 is supported for both axial and rotational displacement by a bracket 39 comprising a pair of bolted but spaced apart flanges 40, 41 which span over cam actuator 37. A coil spring 47 abutting flange 40 normally urges shaft 35 outwardly, to the left in FIGURES 1 and 3, to an inoperative position. Flange 40 of bracket 39 is rigidly secured to end wall 12 of the turret housing by conventional fasteners 31.

As best seen in FIGURE 2, flanges 40, 41 are provided with axially aligned holes 42, 42′, respectively, which, in addition to journaling shaft 35, serve to position it in a predetermined eccentric relation in respect to turret shaft 15. Flanges 40, 41 further include alternate pairs of axially aligned mounting holes 43, 43′ and 44, 44′, respectively, for accommodating shaft 35 in specifically different angular orientation with respect to reference axis 15. Additionally, flange 40 has an offset depending portion 45 which includes a clearance aperture 46 for a driving member 48.

A driving member 48 is disposed eccentrically of fine tuning control shaft 35 and is normally retained in a rest position but is displaceable to an actuated position in a plane which includes the adjustable or gear portion 23 of tuning element 22 for the strip instantaneously in registration with stationary contact bank 24. As a result of such displacement, a driving engagement is effected between driver 48 and gear 23 as required to tune the strip. Member 48 comprises, at one end, a driver in the form of a pinion 49 and, at the opposite end, a pulley 50. The shank portion of member 48 intermediate the gear and pulley sections is provided with an annular slot 51, see FIGURE 3. Driving member 48 is rotatably captivated within the bushing portion 52 of a coupling link or lever 53 by a clip 56, see FIGURE 3, which protrudes through a slit in bushing 52 to cooperate with slot 51 in the shank of member 48. Link 53 is disposed transversely of control shaft 35 and is pivotally mounted upon flange 40 by an eccentric stud 54 which, in turn, is retained in a settable position on flange 40 by a conventional spring washer 57 and retaining clip 58 arrangement. An extremity of bushing 52 includes a stabilizer in the form of an annular groove 55 positioned in the plane of flange aperture 46 and having a width greater than the thickness of the flange. As a result the inner wall of aperture 46, upon intercepting groove 55, limits lateral displacement of coupling link 53 and, of course, driving member 48. Moreover, since the width of groove 55 permits it to embrace the flange edge surrounding aperture 46, the driving member, as well as the coupling link are stabilized when member 48 is moved to its actuated position. Link 53 is held in a rest or inoperative position by a return spring 65.

Link 53 is mechanically engageable with shaft 35 in such a fashion that axial displacement of the shaft displaces the coupling link to move driving member 48 positively to its actuated position. More particularly, and referring again to FIGURE 2, link 53 comprises a plurality of cam follower elements 60, 61, 62 which lie adjacent mounting holes 42′, 43′ and 44′, respectively, for engagement by actuator 37 of shaft 35. The orienting function of eccentric mounting stud 54 is now apparent in that rotation of the stud causes link 53 to be adjusted transversely with respect to control shaft 35 in order to properly position cams 60–62 adjacent respective shaft mounting holes 42′–44′ for engagement by cam actuator 37. This eccentric mount also permits an adjustment of driving member 48 in the plane which includes gear 23 of tuning element 22 thus insuring a positive engagement between pinion 49 and gear 23.

To complete the fine tuning mechanism there is provided means for extending a driving connection from fine tuning control shaft 35 to driving member 48 to effect rotation of the driving member in response to rotation of the shaft. Specifically, a flexible drive belt 66 extends from sheave 38 of cam actuator 37 to pulley 50 of driving member 48. It is appreciated, of course, that a form of gear train could also be employed to effect such driving connection. However, and as will be shown, a belt drive more readily accommodates a multi-positionable fine tuning control shaft.

In order to tune the receiver, drive mechanism 25 is actuated until the turret registers the strip corresponding to a desired station with stator contact bank 24. Simultaneously, the channel indicator arrangement identifies the selected station in window 29. During this channel selection process, fine tuning control shaft 35 remains in its rest position, as shown in FIGURE 1. As a consequence, pinion 49 of member 48 remains clear of the drive gear 23 of each of tuning strips 16. In the event that less than optimum image reproduction and sound quality are attained from the selected strip, vernier or fine tuning may be resorted to in order to improve reception.

Figures 3, 4:
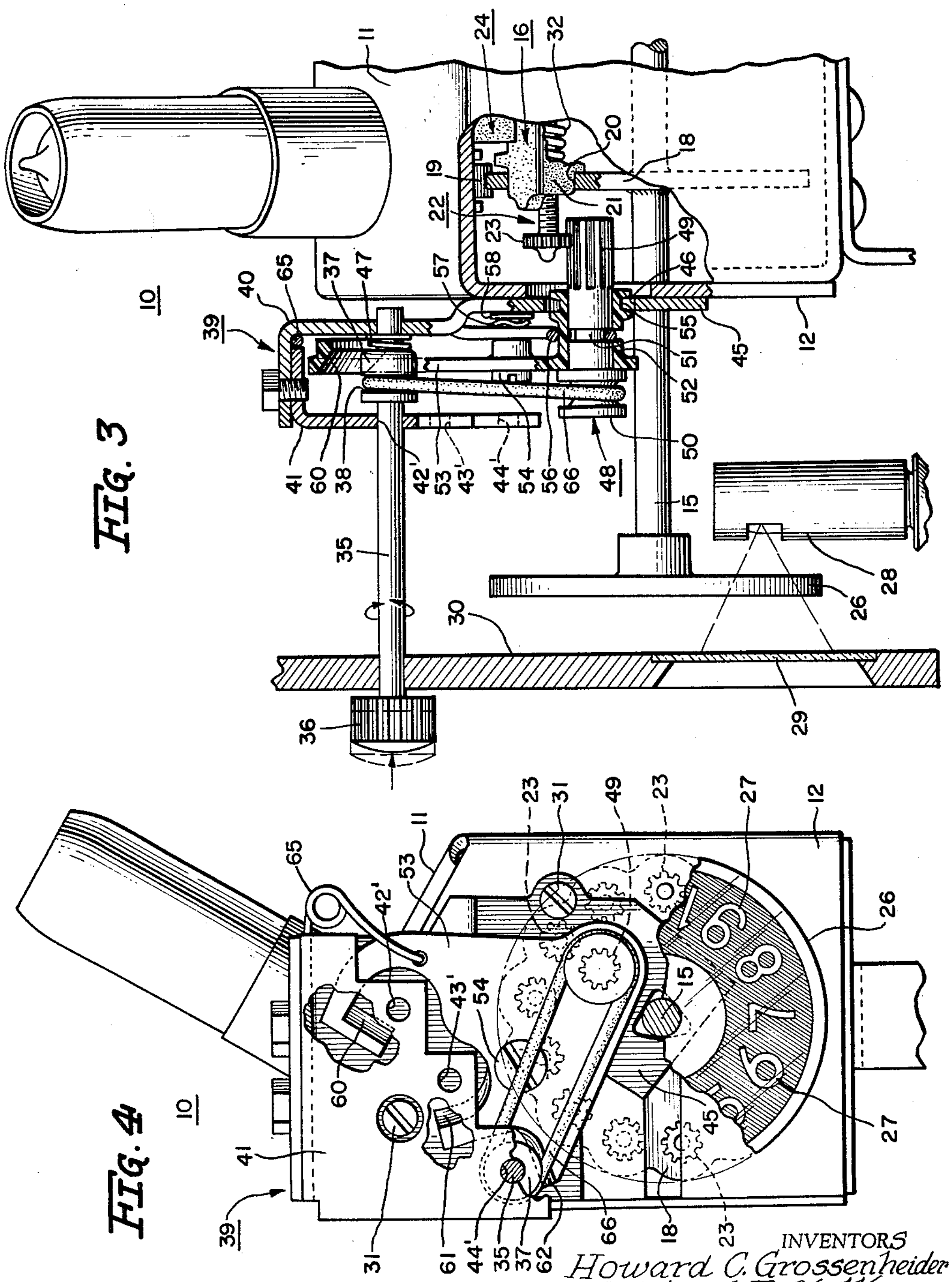
FIGURE 3 is a sectional view taken generally along section lines 3—3 of FIGURE 1 illustrating the actuated position of the fine tuning control mechanism.
FIGURE 4 is an end view of the tuner shown in FIGURE 1 but illustrating an alternate mounting arrangement for the fine tuning control shaft.

To accomplish fine tuning, fine tuning knob 36 is shifted axially in the direction of panel 30 and is rotated. As best seen in FIGURE 3, depression of knob 36 shifts control shaft 35 axially and drives cam actuator 37 against one of cam followers 60, 61 and 62 depending upon the pair of mounting holes 42–42′, 43–43′ and 44–44′ used to mount shaft 35. For the arrangement of FIGURES 1–3, shaft 35 is received in holes 42–42′ and cam actuator 37 engages cam surface 60, thereby pivoting link 53 in a counterclockwise direction, as viewed along control shaft 35. Link 53 rotates and brings pinion 49 positively into engagement with gear 23 on the tuning element of the selected strip. In this actuated position the cooperation between groove 55 and the wall of flange aperture 46 prevents pinion 49 from being cocked when torque is applied thereto via pulley 50 and belt 66. Rotation of control knob 36 in either a clockwise or a counterclockwise direction drives gear 49 and the gear portion 23 of tuning element 22 to modify the inductance of coil 32 until the desired improvement in the video or the sound portions of the received signal has been obtained. At the completion of the tuning operation, knob 36 is released and shaft 35 returns to its normal position under the bias of spring 47, disengaging gears 23 and 49 and link 53 is returned to its rest position by spring 65.

FIGURE 4 is illustrative of the same fine tuning mechanism shown in FIGURES 1–3 but with control shaft 35 in an alternate mounting position. In this arrangement shaft 35 is supported by mounting holes 44, 44′, respectively. As a result cam actuator 37 is now positioned for cooperation with cam follower 62. The operation of the fine tuning mechanism, of course, is the same as previously described regardless of the mounting position of control shaft 35. This view emphasizes the flexibility inherent in the disclosed fine tuning mechanism which permits accommodation of a variety of tuner and cabinet constructions by merely selecting a different mounting for control shaft 35. Moreover, by employing flexible drive belt 66 for transmitting the driving torque of shaft 35 to pinion 49, the accommodation of different control shaft positions is further simplified.

In the disclosed embodiment of the invention a third fine tuning control mounting is also available by inserting shaft 35 in apertures 43, 43′ wherein actuator 37 would cooperate with cam follower 61. It is recognized, of course, that bracket flanges 40, 41 may be shaped and apertured in any desired pattern. Also coupling link 53, including its cam structure, may assume any configuration dictated by a particular application.

Accordingly, the subject invention constitutes a novel fine tuning control mechanism for a television tuner characterized by a flexibility heretofore not realizable. Specifically, a fine tuning control shaft is selectively positionable eccentrically of the tuner axis for cooperation with a driver supporting coupling link which, when actuated by the control shaft, effects positive engagement between the driver and an adjustable tuning element.

While a particular embodiment of the present invention has been shown and described, it is apparent that changes and modifications may be made therein without departing from the invention in its broader aspects. The aim of the appended claims, therefore, is to cover all such changes and modifications as fall within the true spirit and scope of the invention.

We claim:

1. In a wave signal receiver having a tuner in which a plurality of adjustable frequency selectors are disposed in a circular array about a reference axis, a fine tuning mechanism comprising:

a fine tuning control shaft disposed eccentrically of said reference axis at a distance exceeding the radius of said circular array and supported for both axial and rotational displacement;

a driving member disposed eccentrically of said control shaft and normally retained in a rest position but movable to an actuated position in a plane which includes the adjustable portion of the one of said selectors instantaneously in a predetermined index position to effect a driving engagement therewith to tune said one selector;

a coupling link supporting said driving member and disposed transversely of but mechanically engageable with said control shaft for positive displacement, in response to axial displacement of said control shaft, to move said driving member to said actuated position;

and means for extending a driving connection from said control shaft to said driving member to effect rotation of said driving member in response to rotation of said control shaft.

2. In a wave signal receiver having a tuner in which a plurality of adjustable frequency selectors are disposed in a circular array about a reference axis, a fine tuning mechanism comprising:

a fine tuning control shaft bearing a cam actuator and disposed eccentrically of said reference axis at a distance exceeding the radius of said circular array and supported for both axial and rotational displacement;

a driving member disposed eccentrically of said control shaft and normally retained in a rest position but movable to an actuated position in a plane which includes the adjustable portion of the one of said selectors instantaneously in a predetermined index position to effect a driving engagement therewith to tune said one selector;

a coupling link supporting said driving member and disposed transversely of said control shaft;

a cam follower included in said link and mechanically engageable by said cam actuator in response to axial displacement of said control shaft to move said driving member to said actuated position;

and means for extending a driving connection from said control shaft to said driving member to effect rotation of said driving member in response to rotation of said control shaft.

3. In a wave signal receiver having a tuner in which a plurality of adjustable frequency selectors are disposed in a circular array about a reference axis, a fine tuning mechanism comprising:

a fine tuning control shaft bearing a cam actuator;

means for supporting said shaft eccentrically of said reference axis, for both axial and rotational displacement, and in a selected one of a plurality of positions individually spaced from said axis a distance exceeding the radius of said circular array;

a driving member disposed eccentrically of said control shaft and normally retained in a rest position but movable to an actuated position in a plane which includes the adjustable portion of the one of said selectors instantaneously in a predetermined index position to effect a driving engagement therewith to tune said one selector;

a coupling link supporting said driving member and disposed transversely of said shaft;

a corresponding plurality of cam followers included in said link and oriented to present one of said followers in the path of movement of said actuator for each shaft position to effect positive displacement of said driving member to said actuated position in response to axial displacement of said control shaft;

and means for extending a driving connection from said control shaft to said driving member to effect rotation of said driving member in response to rotation of said control shaft.

4. In a wave signal receiver having a tuner in which a plurality of frequency selectors, individually having a rotatable tuning element, are disposed in a circular array about a reference axis, a fine tuning mechanism comprising:

a fine tuning control shaft disposed eccentrically of said reference axis at a distance exceeding the radius of said circular array and supported for both axial and rotational displacement;

a driving member disposed eccentrically of said control shaft and normally retained in a rest position but movable to an actuated position in which said driving member engages the tuning element of the one of said selectors instantaneously in a predetermined index position;

a coupling link supporting said driving member and disposed transversely of but mechanically engageable with said control shaft for positive displacement, in response to axial displacement of said control shaft, to move said driving member to said actuated position;

and means for extending a driving connection from said control shaft to said driving member to effect rotation of said driving member and said tuning element in response to rotation of said control shaft.

5. In a wave signal receiver having a tuner in which a plurality of adjustable frequency selectors are disposed in a circular array about a reference axis, a fine tuning mechanism comprising:

a fine tuning control shaft bearing a cam actuator and disposed eccentrically of said reference axis at a distance exceeding the radius of said circular array and supported for both axial and rotational displacement;

a driving member disposed eccentrically of said control shaft and normally retained in a rest position but movable to an actuated position in a plane which includes the adjustable portion of the one of said selectors instantaneously in a predetermined index position to effect a driving engagement therewith to tune said one selector;

a pivotally mounted lever supporting said driving member and disposed transversely of said control shaft;

a cam follower included in said lever and mechanically engageable by said cam actuator in response to axial displacement of said control shaft to move said driving member to said actuated position;

and means for extending a driving connection from said control shaft to said driving member to effect rotation of said driving member in response to rotation of said control shaft.

References Cited in the file of this patent

UNITED STATES PATENTS 2,942,108 Goldstein et al. ---------- June 21, 1960